(12) United States Patent
Yoon et al.

(10) Patent No.: US 8,596,808 B2
(45) Date of Patent: Dec. 3, 2013

(54) BACKLIGHT MODULE

(75) Inventors: Daekeun Yoon, Beijing (CN); Sangjig Lee, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 77 days.

(21) Appl. No.: 12/727,366

(22) Filed: Mar. 19, 2010

(65) Prior Publication Data
US 2010/0238647 A1 Sep. 23, 2010

(30) Foreign Application Priority Data
Mar. 20, 2009 (CN) .......................... 2009 1 0080569

(51) Int. Cl.
*G09F 13/04* (2006.01)
*F21S 4/00* (2006.01)
*F21V 9/00* (2006.01)

(52) U.S. Cl.
USPC ..................... 362/97.3; 362/249.02; 362/231

(58) Field of Classification Search
USPC .......... 362/97.3, 97.1, 249.02, 104, 227, 231, 362/249.01, 612–613
See application file for complete search history.

(56) References Cited

U.S. PATENT DOCUMENTS

| | | | |
|---|---|---|---|
| 6,325,524 B1 * | 12/2001 | Weber et al. ................... | 362/245 |
| 6,851,831 B2 * | 2/2005 | Karlicek, Jr. ............. | 362/249.06 |
| 7,178,941 B2 * | 2/2007 | Roberge et al. ............... | 362/225 |
| 7,270,461 B2 * | 9/2007 | Chou ............................ | 362/600 |
| 7,303,305 B2 * | 12/2007 | Kennedy ....................... | 362/147 |
| 7,918,575 B2 * | 4/2011 | Ho ................................ | 362/97.3 |
| 2002/0085379 A1 * | 7/2002 | Han et al. ...................... | 362/227 |
| 2006/0244879 A1 * | 11/2006 | Yoon et al. ..................... | 349/71 |
| 2008/0062689 A1 * | 3/2008 | Villard .......................... | 362/250 |
| 2008/0062691 A1 * | 3/2008 | Villard et al. ................. | 362/252 |
| 2008/0111471 A1 * | 5/2008 | Blumel et al. ................ | 313/502 |
| 2008/0137007 A1 * | 6/2008 | Chang et al. .................. | 349/65 |
| 2008/0192457 A1 * | 8/2008 | Krijn et al. .................... | 362/19 |
| 2009/0027883 A1 * | 1/2009 | Koike et al. ................... | 362/235 |
| 2009/0273735 A1 * | 11/2009 | Yeh ................................ | 349/67 |
| 2010/0033956 A1 * | 2/2010 | Kirchberger et al. ........ | 362/97.1 |

FOREIGN PATENT DOCUMENTS

| | | |
|---|---|---|
| CN | 1553261 A | 12/2004 |
| CN | 2735150 Y | 10/2005 |
| CN | 2861718 Y | 1/2007 |
| JP | 2008-244165 A | 10/2008 |
| KR | 20080095591 A | 10/2008 |
| WO | 2004/019657 A2 | 3/2004 |

* cited by examiner

*Primary Examiner* — David J Makiya
*Assistant Examiner* — Bryon T Gyllstrom
(74) *Attorney, Agent, or Firm* — Ladas & Parry LLP

(57) ABSTRACT

Provided is a backlight module comprising a substrate comprising a plurality of honeycombed protrusions arranged on a surface; main tricolor light emitting diodes (LEDs), wherein on each of the honeycombed protrusions of the substrate is provided one of the main tricolor LEDs, and sub tricolor LEDs, each of which is provided between two neighboring honeycombed protrusions.

2 Claims, 6 Drawing Sheets

C-C'

E-E`

BACKLIGHT MODULE

BACKGROUND

Embodiments of the present invention relate to a backlight module of a liquid crystal display.

At present, LCDs (liquid crystal displays) have become the majority types of flat panel displays. As liquid crystal in a LCD per se does not emit light, a LCD needs a backlight module as a light source to display images. Most of the LCDs of related art are of transmitting type, and a backlight module is a necessary component part of a transmitting type LCD.

In the backlight modules of the related art, LEDs (light-emitting diodes) can be used as light sources. FIG. 1a is a schematic view of a backlight module of the related art using white LEDs. FIG. 1b is a schematic sectional view taken along line A-A' of FIG. 1a. As shown in FIGS. 1a and 1b, the backlight module of the related art comprises a substrate 20 for disposing LEDs thereon and white LEDs 10. Substrate 20 has a structure of honeycombed protrusions, and a white LED is provided on each of the honeycombed protrusions.

For improving color reproduction, a white LED can be replaced with tricolor LED, that is, a red LED, a blue LED and a green LED.

FIG. 2a is a schematic view of a backlight module of the related art using tricolor LEDs. FIG. 2b is a schematic sectional view taken along line B-B' of FIG. 2a. As shown in FIGS. 2a and 2b, the backlight module of the related art comprises a substrate 20 for disposing tricolor LEDs thereon and red LEDs 11, blue LEDs 12 and green LEDs 13 provided on honeycombed protrusions of the substrate 20.

For a backlight module using tricolor LEDs, there is no overlapping region of light of different colors within a height range of H, and there are overlapping regions of light of only two colors within a height range of 2H. As a result, for a backlight module using tricolor LEDs, white light can be only formed outside the height range of 2H. That is, a backlight module using tricolor LEDs has a thickness increased by 2H as compared with the thickness of a backlight module using white LEDs.

SUMMARY

An embodiment provides a backlight module, comprising: a substrate comprising a plurality of honeycombed protrusions arranged on a surface; main tricolor light emitting diodes (LEDs), wherein on each of the honeycombed protrusions of the substrate is provided one of the main tricolor LEDs, and sub tricolor LEDs, each of which is provided between two neighboring honeycombed protrusions.

According to the present invention, an overlapping region of light of three colors is effectively formed outside the height range of H by providing tricolor LEDs among honeycombed protrusions, so that the shortcoming of related art that an overlapping region of light of three colors can be only formed outside the height range of 2H is overcome, and a thickness of a backlight module using tricolor LEDs is effectively controlled.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein:

FIG. 1b is a schematic sectional view taken along line A-A' of FIG. 1a;

FIG. 2b is a schematic sectional view taken along line B-B' of FIG. 2a;

FIG. 3b is a schematic sectional view taken along line C-C' of FIG. 3a;

FIG. 5b is a schematic sectional view taken along line D-D' of FIG. 5a;

FIG. 6b is a schematic sectional view taken along line E-E' of FIG. 6a.

DETAILED DESCRIPTION OF THE EMBODIMENTS

First Embodiment of the Backlight Module of the Present Invention

Figure 1A:
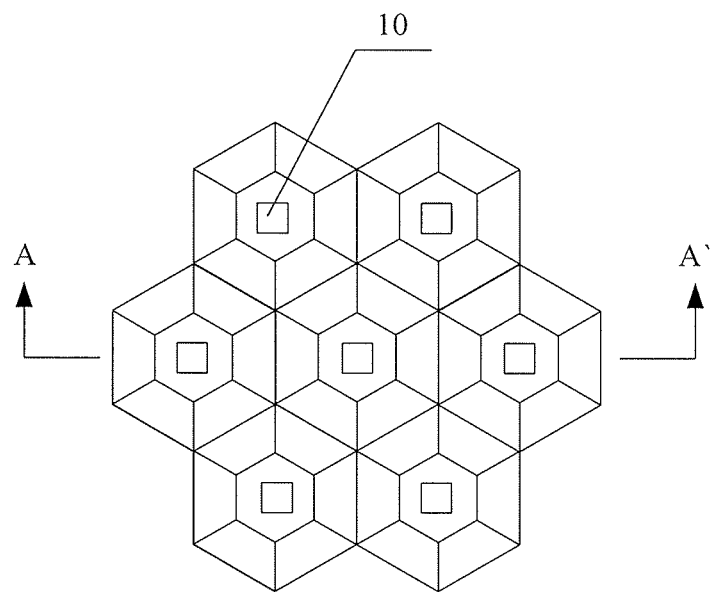
FIG. 1a is a schematic view of a backlight module of related art using white LEDs.
Figure 1B:
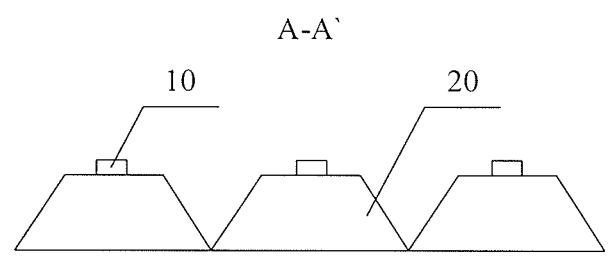
Figure 2A:
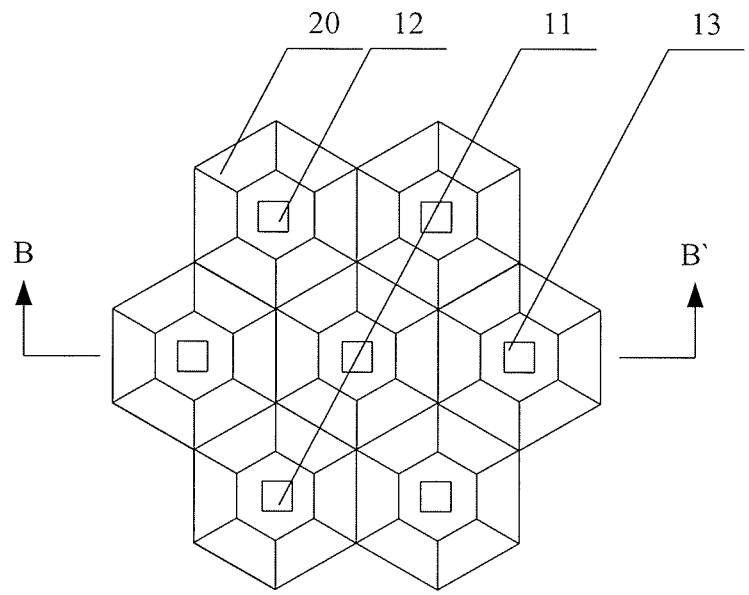
FIG. 2a is a schematic view showing tricolor LEDs are used in a backlight module of related art.
Figure 2B:
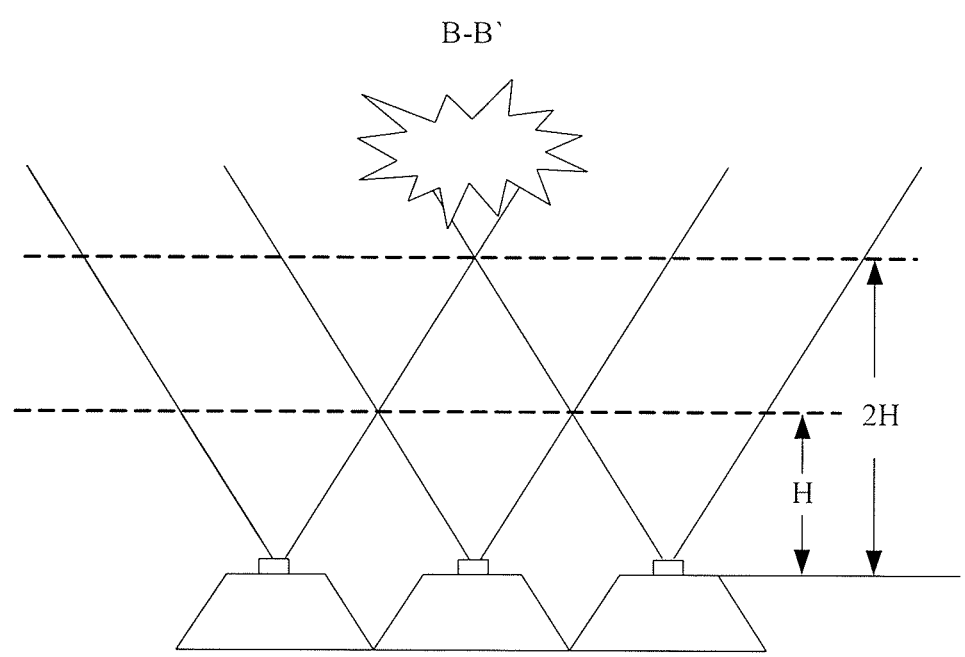
Figure 3A:
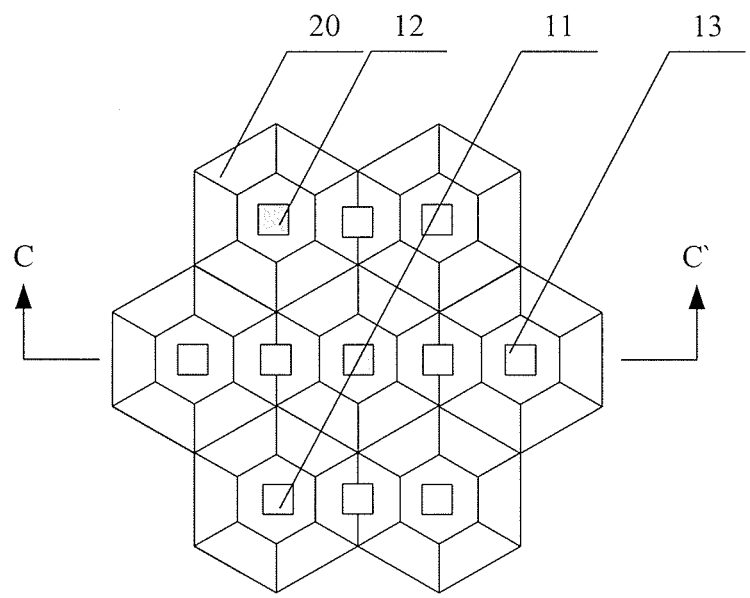
FIG. 3a is a schematic view of a first embodiment of the backlight module of the present invention.
Figure 3B:
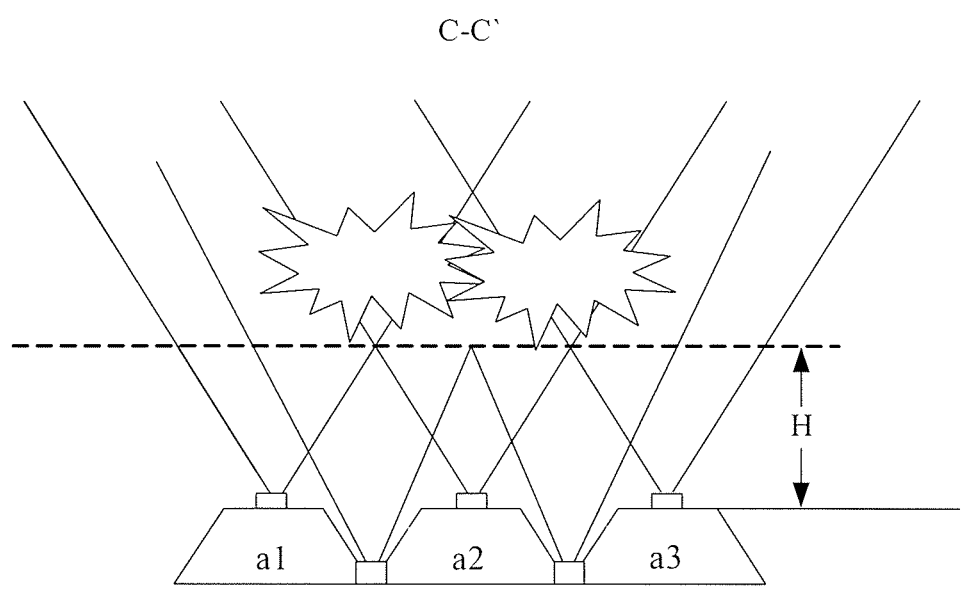

FIG. 3a is a schematic view of the first embodiment of the backlight module of the present invention. FIG. 3b is a schematic sectional view taken along line C-C' of FIG. 3a. As shown in FIGS. 3a and 3b, the backlight module of this embodiment comprises: a substrate 20 and tricolor LEDs. The substrate has a structure of honeycombed protrusions and on each of the honeycombed protrusions is provided a tricolor LED. For example, on a first protrusion a1 is provided a red LED, on a second protrusion a2 is provided a blue LED, and on a third protrusion a3 is provided a green LED. Further, in a groove between two honeycombed protrusions neighboring in a first direction such as the horizontal direction is provided a tricolor LED. For example, in a groove between the first protrusion a1 and the second protrusion a2 that are adjacent in the horizontal direction is provided a green LED 13, and in a groove between the second protrusion a2 and a third protrusion a3 that are adjacent in the horizontal direction is provided a red LED 11. Here, the first direction is not limited to the horizontal direction but can be an oblique direction at an angle of 60 degree with respect to the horizontal direction.

In this embodiment, in a groove between two honeycombed protrusions neighboring in a first direction is provided a tricolor LED, and at the same time in a groove between two honeycombed protrusions neighboring in a second direction, which is different from the first direction, is provided a tricolor LED.

According to this embodiment, an overlapping a mixing region of light of three colors is effectively formed outside the height range of H by providing tricolor LEDs in grooves between honeycombed protrusions neighboring in the first direction, so that the shortcoming of the related art that an overlapping region of light of three colors can be only formed outside the height range of 2H can be overcame, and the thickness of a backlight module using tricolor LEDs is effectively controlled.

In this embodiment, specific distribution of tricolor LEDs can be designed according to specific products.

Second Embodiment of the Backlight Module of the Present Invention

Figure 4A:
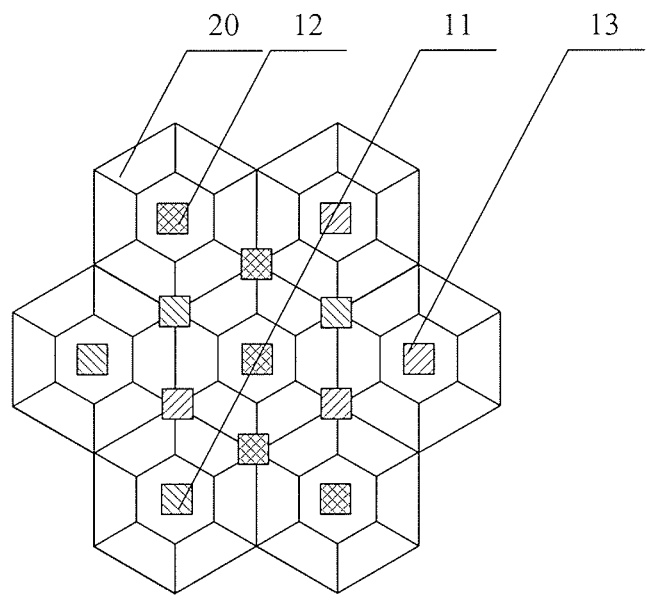
FIG. 4a is a schematic view of a second embodiment of the backlight module of the present invention.
Figure 4B:
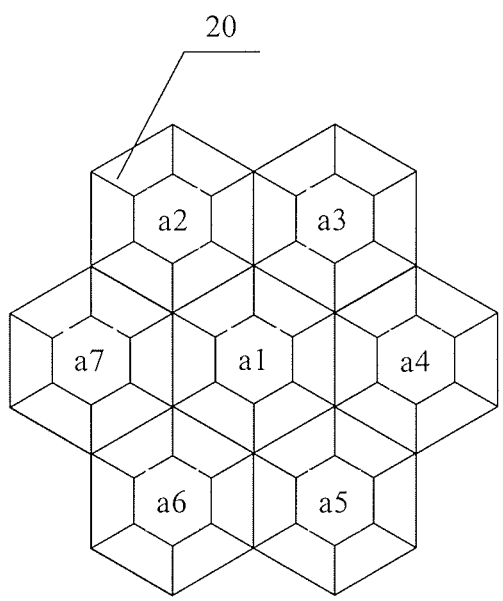
FIG. 4b is a schematic view of a substrate used in the second embodiment of the backlight module of the present invention.

FIG. 4a is a schematic view of the second embodiment of the backlight module of the present invention. FIG. 4b is a schematic view of a substrate used in the second embodiment of the backlight module of the present invention. As shown in FIGS. 4a and 4b, the backlight module of this embodiment comprises: a substrate 20 and tricolor LEDs. The substrate has a structure of honeycombed protrusions and on each of the honeycombed protrusions is provided a tricolor LED. For example, on a first protrusion a1 is provided a blue LED 12, on a second protrusion a2 is provided a blue LED 12, on a third protrusion a3 is provided a green LED 13, on a fourth protrusion a4 is provided a green LED 13, on a fifth protrusion a5 is provided a red LED 11, on a sixth protrusion a6 is provided a red LED 11, and on a seventh protrusion a7 is provided a red LED 11. Further, in a recess among three neighboring honeycombed protrusions is provided a tricolor LED, and these three neighboring honeycombed protrusions are arranged with an interval of 120 degree among one another. For example, in the recess among the first, the second and the third protrusions is provided a blue LED 12; in a recess among the first, the third and the fourth protrusions is provided a red LED 11, and in a recess among the first, the fourth and the fifth protrusions is provided a green LED 13. In this order, each of the six recesses around the first protrusion is provided with a tricolor LED, and the six recesses are provided equally at the six apex angles of the first protrusion.

According to this embodiment, an overlapping region of light of three colors is effectively formed outside the height range of H by providing tricolor LEDs in recesses among three neighboring honeycombed protrusions, so that the shortcoming of the related art that an overlapping region of light of three colors can be only formed outside the height range of 2H is overcome, and a thickness of a backlight module using tricolor LEDs is effectively controlled.

In this embodiment, specific distribution of tricolor LEDs can be designed according to specific products.

Third Embodiment of the Backlight Module of the Present Invention

Figure 5A:
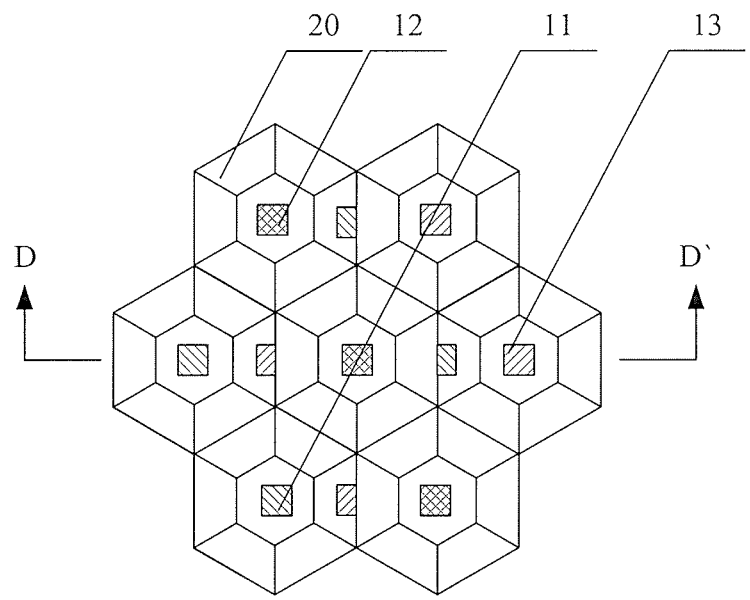
FIG. 5a is a schematic view of a third embodiment of the backlight module of the present invention.
Figure 5B:
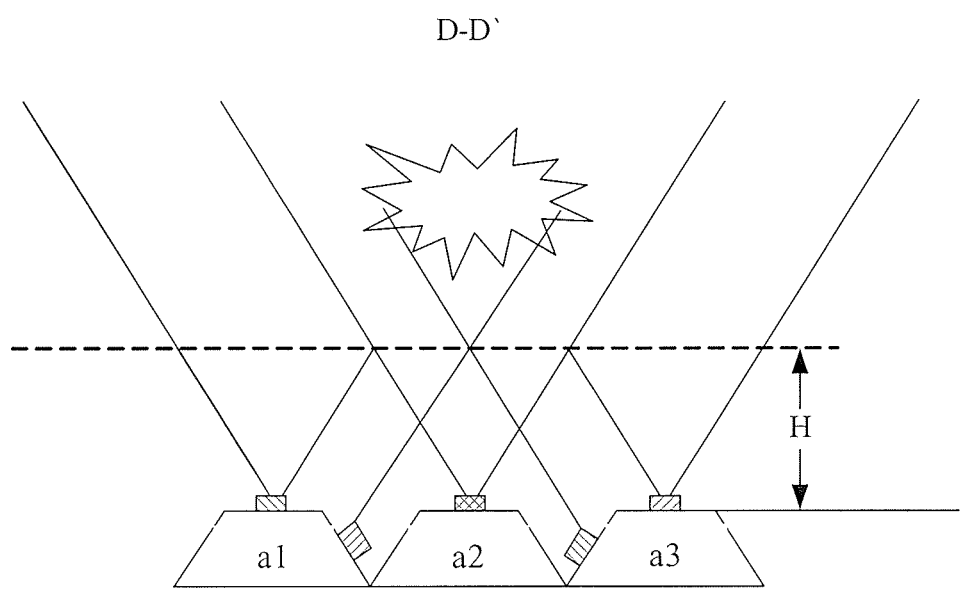

FIG. 5a is a schematic view of the first embodiment of the backlight module of the present invention. FIG. 5b is a schematic sectional view taken along line D-D' of FIG. 5a. As shown in FIGS. 5a and 5b, the backlight module of this embodiment comprises: a substrate 20 and tricolor LEDs. The substrate has a structure of honeycombed protrusions and on each of the honeycombed protrusions is provided a tricolor LED. For example, on a first protrusion a1 is provided a red LED, on a second protrusion a2 is provided a blue LED, and on a third protrusion a3 is provided a green LED. Further, on a side surface, for example, a left or right side surface of the groove, between two honeycombed protrusions neighboring in a first direction, such as the horizontal direction, is provided a tricolor LED. For example, on a left side surface of the groove between the first and the second protrusions is provided a green LED 13, and on a right side surface of the groove between the second and the third protrusions is provided a red LED 11. Here, the first direction is not limited to the horizontal direction but can be an oblique direction at an angle of 60 degree with respect to the horizontal direction.

In this embodiment, on a side surface of the groove between two honeycombed protrusions neighboring in a first direction is provided a tricolor LED, and at the same time on a side surface of the groove between two honeycombed protrusions neighboring in a second direction, which is different from the first direction, is provided a tricolor LED.

According to this embodiment, an overlapping region of light of three colors is effectively formed outside the height range of H by providing tricolor LEDs on side surfaces between honeycombed protrusions, so that the shortcoming of related art that an overlapping region of light of three colors can be only formed outside the height range of 2H is overcome, and a thickness of a backlight module using tricolor LEDs is effectively controlled.

In this embodiment, specific distribution of tricolor LEDs can be designed according to specific products.

Fourth Embodiment of the Backlight Module of the Present Invention

Figure 6A:
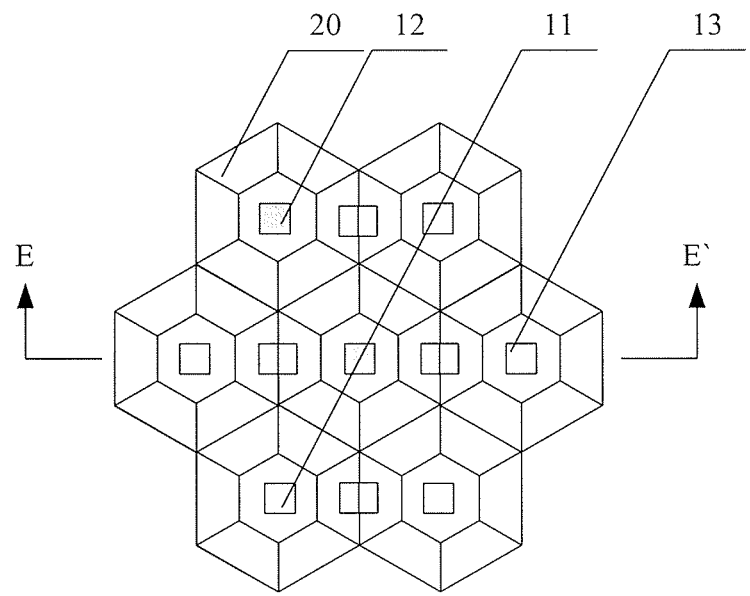
FIG. 6a is a schematic view of a fourth embodiment of the backlight module of the present invention.
Figure 6B:
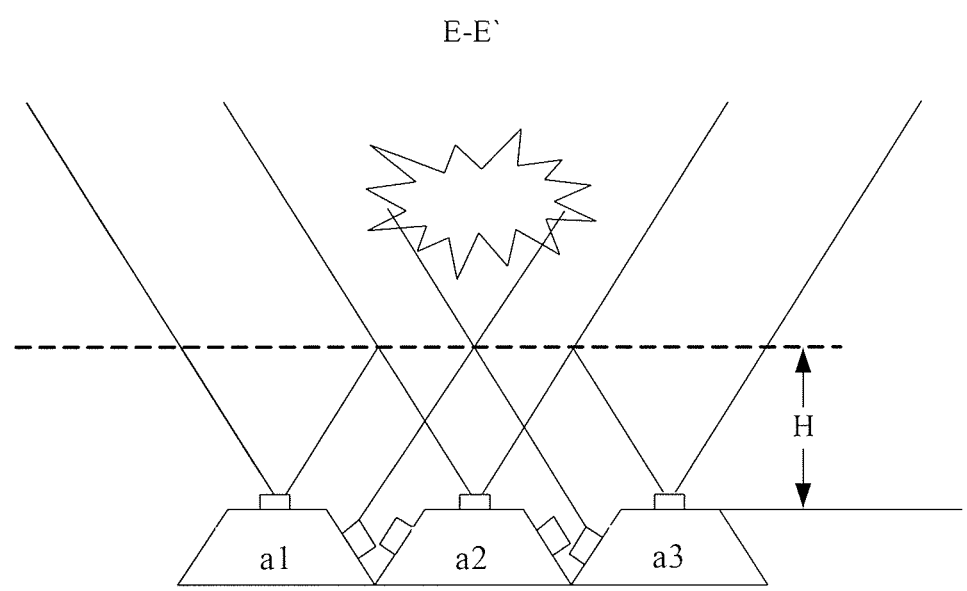

FIG. 6a is a schematic view of the fourth embodiment of the backlight module of the present invention. FIG. 6b is a schematic sectional view taken along line E-E' of FIG. 6a. As shown in FIGS. 6a and 6b, the backlight module of this embodiment comprises: a substrate 20 and tricolor LEDs. The substrate has a structure of honeycombed protrusions, and on each of the honeycombed protrusions is provided a tricolor LED. For example, on a first protrusion a1 is provided a red LED 11, on a second protrusion a2 is provided a blue LED 12, and on a third protrusion a3 is provided a green LED 13. Further, on each of two side surfaces of the groove between two honeycombed protrusions neighboring in a first direction such as a horizontal direction is provided a tricolor LED, respectively. For example, on the left side surface of the groove between the first and the second protrusions is provided a green LED 13, on the right side surface of the second protrusion between the first and the second protrusions is provided a red LED 11; on the left side surface of the groove between the second and the third protrusions is provided a red LED 11, and on the right side surface of the groove between the second and the third protrusions is provided a red LED 11. Here, the first direction is not limited to the horizontal direction but can be an oblique direction at an angle of 60 degree with respect to the horizontal direction.

In this embodiment, on each of two side surfaces of the groove between two honeycombed protrusions neighboring in a first direction is provided a tricolor LED, respectively, and at the same time on each of two side surfaces of the groove between two honeycombed protrusions neighboring in a second direction, which is different from the first direction, is provided a tricolor LED, respectively.

According to this embodiment, an overlapping region of light of three colors is effectively formed outside the height range of H by providing tricolor LEDs on two side surfaces between honeycombed protrusions, so that the shortcoming of related art that an overlapping region of light of three colors can be only formed outside the height range of 2H is overcome, and a thickness of a backlight module using tricolor LEDs is effectively controlled.

In this embodiment, specific distribution of tricolor LEDs can be designed according to specific products.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A backlight module, comprising:
   a substrate comprising a plurality of hexagonal protrusions in a honeycombed arrangement provided on a surface;
   main tricolor light emitting diodes (LEDs), wherein on each of the hexagonal protrusions of the substrate is provided one of the main tricolor LEDs,
   sub tricolor LEDs, each of which is provided between two neighboring hexagonal protrusions, and
   wherein the sub tricolor LEDs comprise tricolor LEDs each provided in a recess among three neighboring hexagonal protrusions, and the three neighboring hexagonal protrusions are arranged with an interval of 120 degree among one another.

2. The backlight module of claim 1, wherein the main tricolor LEDs and sub tricolor LEDs comprise red LEDs, blue LEDs and green LEDs.

\* \* \* \* \*